US010891998B2

(12) United States Patent
Kim et al.

(10) Patent No.: US 10,891,998 B2
(45) Date of Patent: Jan. 12, 2021

(54) MEMORY DEVICE OPERATING BASED ON A WRITE CURRENT FOR A GIVEN OPERATION CONDITION AND A METHOD OF DRIVING THE WRITE CURRENT

(71) Applicant: SAMSUNG ELECTRONICS CO., LTD., Suwon-si (KR)

(72) Inventors: Chankyung Kim, Hwaseong-si (KR); Taehyun Kim, Seoul (KR); Seongui Seo, Suwon-si (KR); Sangjung Jeon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/401,236

(22) Filed: May 2, 2019

(65) Prior Publication Data

US 2020/0035281 A1    Jan. 30, 2020

(30) Foreign Application Priority Data

Jul. 27, 2018 (KR) .................. 10-2018-0087767

(51) Int. Cl.
*G11C 13/00* (2006.01)
*G11C 11/16* (2006.01)

(52) U.S. Cl.
CPC ........ *G11C 11/1675* (2013.01); *G11C 11/161* (2013.01)

(58) Field of Classification Search
CPC ................................. G11C 11/1675
USPC ......................................... 365/185.2
See application file for complete search history.

(56) References Cited

U.S. PATENT DOCUMENTS

| 2005/0078537 | A1* | 4/2005  | So ................ G11C 5/143 365/211 |
| 2006/0227598 | A1  | 10/2006 | Sakimura et al. |
| 2010/0110815 | A1  | 5/2010  | Lee et al. |
| 2012/0086476 | A1  | 4/2012  | Yuh et al. |
| 2012/0155155 | A1* | 6/2012  | Katti ............ G11C 11/1697 365/158 |
| 2012/0155157 | A1* | 6/2012  | Oh ............... G11C 11/1675 365/158 |
| 2014/0185361 | A1  | 7/2014  | Oh et al. |
| 2014/0321195 | A1* | 10/2014 | Antonyan ...... G11C 11/1675 365/148 |
| 2016/0211031 | A1  | 7/2016  | Taigor et al. |
| 2017/0069380 | A1* | 3/2017  | Takahashi ...... G11C 13/0069 |
| 2017/0162242 | A1  | 6/2017  | Abedifard et al. |
| 2017/0206961 | A1* | 7/2017  | Yoon ............. G06F 3/0656 |
| 2017/0263299 | A1* | 9/2017  | Takizawa ...... G11C 11/1673 |
| 2017/0345496 | A1* | 11/2017 | Liu .............. G11C 13/0097 |
| 2018/0108406 | A1  | 4/2018  | Kang et al. |
| 2019/0279709 | A1* | 9/2019  | Lee .............. G11C 29/81 |

* cited by examiner

*Primary Examiner* — Min Huang
(74) *Attorney, Agent, or Firm* — F. Chau & Associates, LLC

(57) ABSTRACT

A memory device including: a memory cell array including a memory cell, the memory cell configured to store first data based on a first write current; a write driver configured to output the first write current based on a control value; and a current controller including a replica memory cell, the current controller configured to generate the control value based on a state of second data which is stored in the replica memory cell, wherein an intensity of the first write current is adjusted based on the control value.

16 Claims, 13 Drawing Sheets

MEMORY DEVICE OPERATING BASED ON A WRITE CURRENT FOR A GIVEN OPERATION CONDITION AND A METHOD OF DRIVING THE WRITE CURRENT

CROSS-REFERENCE TO RELATED APPLICATION

This application claims priority under 35 U.S.C. § 119 to Korean Patent Application No. 10-2018-0087767 filed on Jul. 27, 2018, in the Korean Intellectual Property Office, the disclosure of which is incorporated by reference herein in its entirety.

TECHNICAL FIELD

The present inventive concept relates to an electronic device, and more particularly, to configurations and operations of a memory device.

DESCRIPTION OF RELATED ART

Various types of electronic devices are currently being used. An electronic device can perform its own functions depending on operations of various electronic circuits included in the electronic device. The electronic device may operate independently or while communicating with another electronic device.

A memory device is an example of an electronic device. The memory device includes memory elements each of which is configured to store a data value based on an electronic signal (e.g., a voltage or a current). This data may be stored temporarily or for a long period of time. In response to an external request, the memory device stores data or outputs stored data. The data which is stored by the memory device may be used for an operation of an electronic device or an electronic system including the memory device.

As more information is generated and communicated between electronic devices, memory devices are being widely employed. Research and development for improving characteristics (such as capacity, reliability, operation efficiency, and/or the like) of the memory device are currently underway. In particular, memory devices operating with low power are being developed for mobile and/or portable devices.

SUMMARY

According to exemplary embodiments of the present inventive concept, there is provided a memory device comprising: a memory cell array comprising a memory cell, the memory cell configured to store first data based on a first write current; a write driver configured to output the first write current based on a control value; and a current controller comprising a replica memory cell, the current controller configured to generate the control value based on a state of second data which is stored in the replica memory cell, wherein an intensity of the first write current is adjusted based on the control value.

According to exemplary embodiments of the present inventive concept, there is provided a memory device comprising: a memory cell array configured to store data based on a first write current; a write driver configured to drive the first write current based on a control value, such that a first intensity of the first write current is adjusted; and a current controller configured to: select a second write current, which changes a state of the data, from among a plurality of write currents having different intensities, and generate the control value corresponding to a second intensity of the second write current, wherein the first intensity is adjusted to correspond to the second intensity based on the control value.

According to exemplary embodiments of the present inventive concept, there is provided a memory device comprising: first transistors configured to drive first write currents having different intensities; replica memory cells configured to store data based on the first write currents; a control value generation circuit configured to generate a control value depending on whether states of the data stored in the replica memory cells are switched based on the first write currents; second transistors configured to drive a second write current as each of the second transistors is turned on or turned off based on the control value; and a memory cell array configured to store data based on the second write current, wherein the control value is associated with an intensity of a switch write current of the first write currents, wherein the switch write current switches the states of the data stored in the replica memory cells.

According to exemplary embodiments of the present inventive concept, there is provided a memory device comprising: a memory cell array configured to store data based on a first write current; a write driver configured to output the first write current; and one or more replica memory cells configured to store data based on a plurality of write currents having different intensities, wherein states of the data stored in the one or more replica memory cells are changed or maintained, based on the plurality of write currents, and the write driver is configured to drive the first write current such that an intensity of the first write current corresponds to an intensity of a second write current of the plurality of write currents, wherein the second write current changes the states of the data stored in the one or more replica memory cells.

According to exemplary embodiments of the present inventive concept, there is provided a method of driving a write current for storing data in a memory cell, the method comprising: supplying a first write current having a first intensity and a second write current having a second intensity to a first replica memory cell and a second replica memory cell respectively; sensing first data stored in the first replica memory cell and second data stored in the second replica memory cell to determine whether a state of the first data is switched based on the first write current and whether a state of the second data is switched based on the second write current; and when it is determined that the state of the first data is switched and the state of the second data is not switched, driving a third write current having an intensity corresponding to the first intensity such that the data is stored in the memory cell based on the third write current.

According to exemplary embodiments of the present inventive concept, there is provided a memory device comprising: a memory cell array comprising a memory cell, the memory cell configured to store first data in response to a first write current; a write driver configured to generate the first write current in response to a control value; and a current controller comprising a copy of the memory cell, the current controller configured to generate the control value based on a state of second data which is stored in the copy of the memory cell, wherein the first write current is adjusted based on the control value.

BRIEF DESCRIPTION OF THE DRAWINGS

The above and other features of the present inventive concept will become apparent by describing in detail exemplary embodiments thereof with reference to the accompanying drawings.

DETAILED DESCRIPTION OF THE EMBODIMENTS

Figure 1:
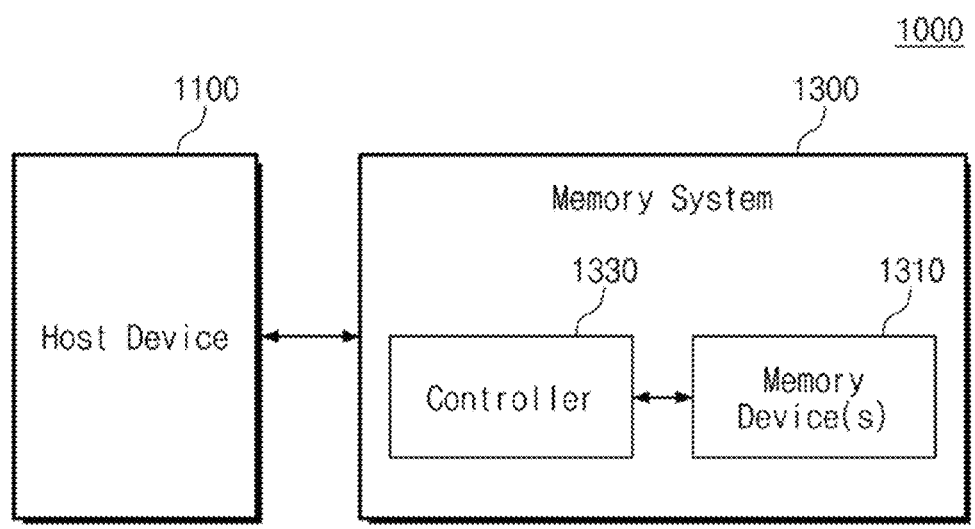
FIG. 1 is a block diagram illustrating an electronic system which includes a memory system according to exemplary embodiments of the present inventive concept.

FIG. 1 is a block diagram illustrating an electronic system 1000 which includes a memory system 1300 according to exemplary embodiments of the present inventive concept.

The electronic system 1000 may include a host device 1100 and the memory system 1300. For example, the electronic system 1000 may be implemented in electronic devices such as a desktop computer, a laptop computer, a tablet computer, a smart phone, a wearable device, a video game console, a server, an electric vehicle, a home appliance, and a medical device.

The host device 1100 and the memory system 1300 may be included in one electronic device or may be distributed on different electronic devices. In some cases, the memory system 1300 may be implemented together with the host device 1100 on one chip or package (e.g., on a single system-on-chip (SoC)).

The host device 1100 may be an electronic device which is capable of performing operations required by the electronic system 1000. For example, the host device 1100 may store data in the memory system 1300 or may read data stored in the memory system 1300.

For example, the host device 1100 may be a main processor (e.g., a central processing unit (CPU), an application processor (AP), or the like), a dedicated processor (e.g., a graphics processing unit (GPU)), a modulator/demodulator (MODEM), an image sensor, and/or the like. In addition, the host device 1100 may be any device which is capable of using the memory system 1300.

The memory system 1300 may store data which is used for an operation of the electronic system 1000. For example, the memory system 1300 may store write data requested by the host device 1100 or may provide the host device 1100 with read data requested by the host device 1100.

To accomplish this, the memory system 1300 may include one or more memory devices 1310 and a controller 1330. The number of the memory devices 1310 may be variously changed or modified depending on the requirement (e.g., capacity, performance, purpose, size, and/or the like) of the memory system 1300. However, for brevity, in the following descriptions, it will be assumed that the memory system 1300 includes one memory device 1310.

The memory device 1310 may include a memory element configured to store data and to output the stored data. For example, the memory element may include a volatile memory and/or a nonvolatile memory.

The controller 1330 may control overall operations of the memory system 1300. For example, the controller 1330 may control the memory device 1310 in response to a request of the host device 1100 such that data is stored in the memory device 1310 or is read from the memory device 1310. For example, the controller 1330 may provide various operations such as data error correction, performance management, attack prevention, and/or the like.

In exemplary embodiments of the present inventive concept, the memory device 1310 and the controller 1330 may be implemented on one chip. In some cases, the memory device 1310 and the controller 1330 may be implemented in separate chips and may be mounted on one package or circuit board.

In exemplary embodiments of the present inventive concept, the memory system 1300 may be employed as a storage device of the electronic system 1000. In exemplary embodiments of the present inventive concept, the memory system 1300 may be employed as a working memory or a buffer memory for the host device 1100. A configuration and an operation of the memory system 1300 may be variously changed or modified depending on an implementation of the electronic system 1000.

Figure 2:
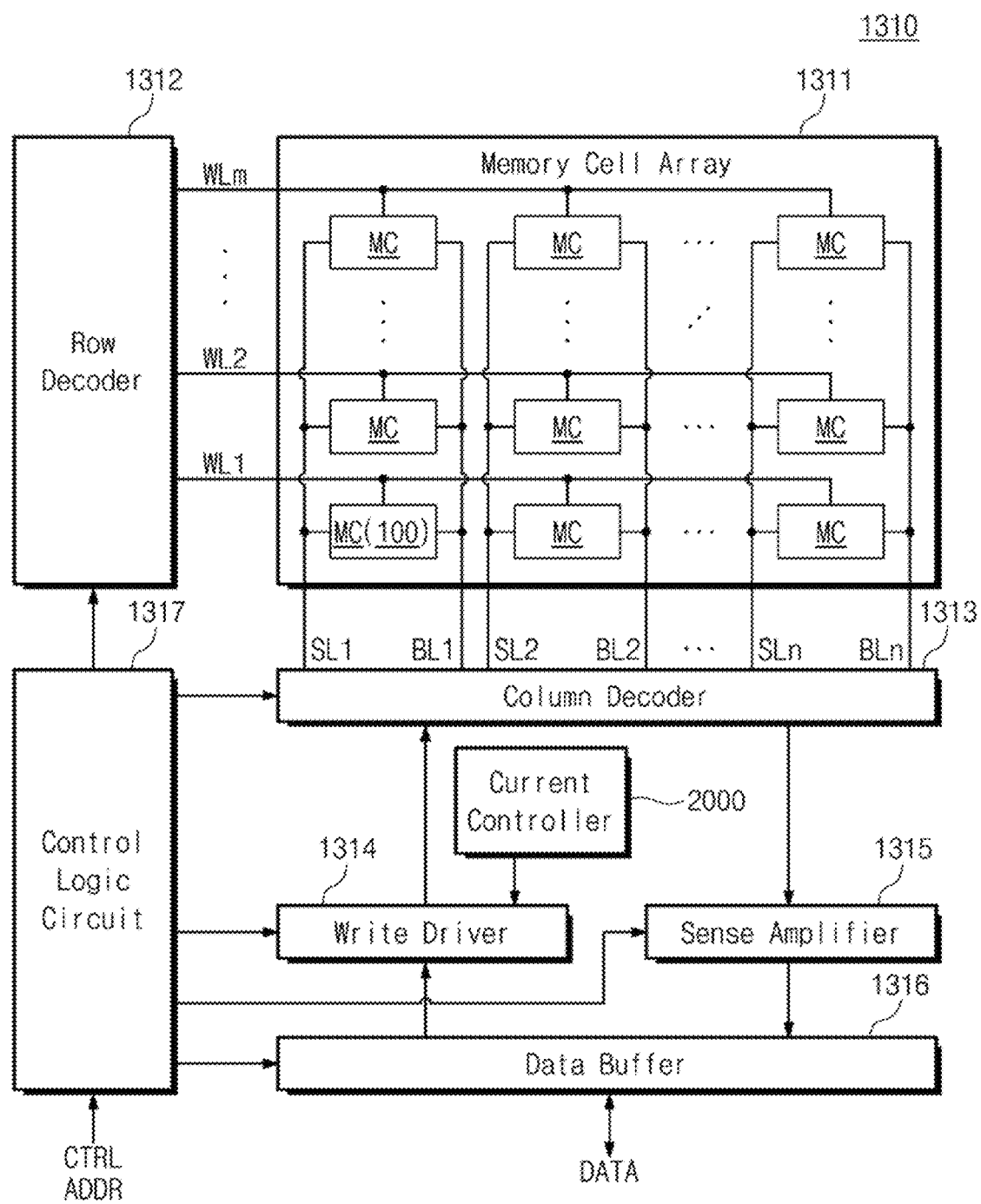
FIG. 2 is a block diagram illustrating a memory device of FIG. 1, according to an exemplary embodiment of the present inventive concept.

FIG. 2 is a block diagram illustrating the memory device 1310 of FIG. 1, according to an exemplary embodiment of the present inventive concept.

The memory device 1310 may include a memory cell array 1311, a row decoder 1312, a column decoder 1313, a write driver 1314, a sense amplifier 1315, a data buffer 1316, a control logic circuit 1317, and a current controller 2000. FIG. 2 is provided to facilitate better understanding of the present inventive concept, and is not intended to limit the present inventive concept. The memory device 1310 may not include some of the components of FIG. 2 or may further include a component not illustrated in FIG. 2.

The memory cell array 1311 may include memory cells MCs each of which is configured to store data. The memory cell array 1311 may store data in the memory cells MCs, and may output data stored in the memory cells MCs.

Each memory cell MC may include a memory element which is capable of storing a data value. For example, each memory cell MC may be implemented with a volatile memory such as a static random access memory (SRAM), a dynamic RAM (DRAM), a synchronous DRAM (SDRAM) and/or the like, and/or a nonvolatile memory such as a flash memory, a phase-change RAM (PRAM), a magneto-resistive RAM (MRAM), a resistive RAM (ReRAM), a ferroelectric RAM (FRAM) and/or the like.

The present inventive concept is not limited to the above examples, and a type of each memory cell MC may be variously changed or modified depending on the implementation of the memory system 1300. However, to facilitate better understanding, example configurations and characteristics of a memory cell 100 among the memory cells MCs will be described with reference to FIGS. 3 to 8.

The memory cells MCs may be connected to source lines SL1, SL2, . . . SLn, bit lines BL1, BL2, . . . BLn, and word lines WL1, WL2, . . . WLm. Memory cells MCs arranged along a row may be connected in common to a respective one of the word lines WL1, WL2, . . . WLm. Memory cells MCs arranged along a column may be connected in common to a respective one of the source lines SL1, SL2, . . . SLn and a respective one of the bit line BL1, BL2, . . . BLn.

The row decoder 1312 may control voltages of the word lines WL1, WL2, . . . WLm under control of the control logic circuit 1317, such that selected memory cells MCs connected to a selected word line store or output data. The column decoder 1313 may connect the source lines SL1, SL2, . . . SLn and the bit lines BL1, BL2, . . . BLn to the write driver 1314 and the sense amplifier 1315 under control of the control logic circuit 1317, such that the selected memory cells MCs store or output data.

The write driver 1314 may output a write current under control of the control logic circuit 1317. The write current may be used to store a data value in each memory cell MC. For example, in response to the write current, a state of data stored in each memory cell MC may change from a first value (e.g., logic "0") to a second value (e.g., logic "1") or may change from the second value to the first value.

The write driver 1314 may drive the write current such that data of an intended value is stored in each memory cell MC. To accomplish this, in a write operation, the write driver 1314 may be connected to a selected one of the source lines SL1, SL2, . . . SLn and a selected one of the bit lines BL1, BL2, . . . BLn through the column decoder 1313.

In exemplary embodiments of the present inventive concept, the current controller 2000 may be connected to the write driver 1314 to adjust an intensity of the write current. As will be described with reference to FIGS. 7 and 8, an optimum intensity of the write current may change depending on an operation condition (e.g., an operation temperature) of the memory device 1310. The current controller 2000 may control the write driver 1314 such that the write current has the intensity suitable for the operation condition. Exemplary embodiments of the present inventive concept associated with the write driver 1314 and the current controller 2000 will be described with reference to FIGS. 9 to 18.

The sense amplifier 1315 may sense a value of data stored in each memory cell MC under control of the control logic circuit 1317. To accomplish this, in a read operation, the sense amplifier 1315 may be connected to a selected one of the source lines SL1, SL2, . . . SLn and a selected one of the bit lines BL1, BL2, . . . BLn through the column decoder 1313.

The data buffer 1316 may buffer data under control of the control logic circuit 1317. For example, the data buffer 1316 may buffer data to be output to an outside of the memory device 1310 and data received from the outside of the memory device 1310. For example, the data may be exchanged with the controller 1330 outside the memory device 1310.

In the write operation, the data received from the outside of the memory device 1310 may be provided to the write driver 1314 after being buffered in the data buffer 1316. In the read operation, the data sensed by the sense amplifier 1315 may be output to the outside of the memory device 1310 after being buffered in the data buffer 1316. Accordingly, the data may be stored in the memory cell array 1311 or may be output from the memory cell array 1311.

The control logic circuit 1317 may receive a control signal CTRL and an address ADDR from the controller 1330 outside the memory device 1310. The control logic circuit 1317 may control the row decoder 1312, the column decoder 1313, the write driver 1314, the sense amplifier 1315, and the data buffer 1316 in response to the control signal CTRL such that a memory cell MC directed by the address ADDR stores or outputs data.

Figure 3:
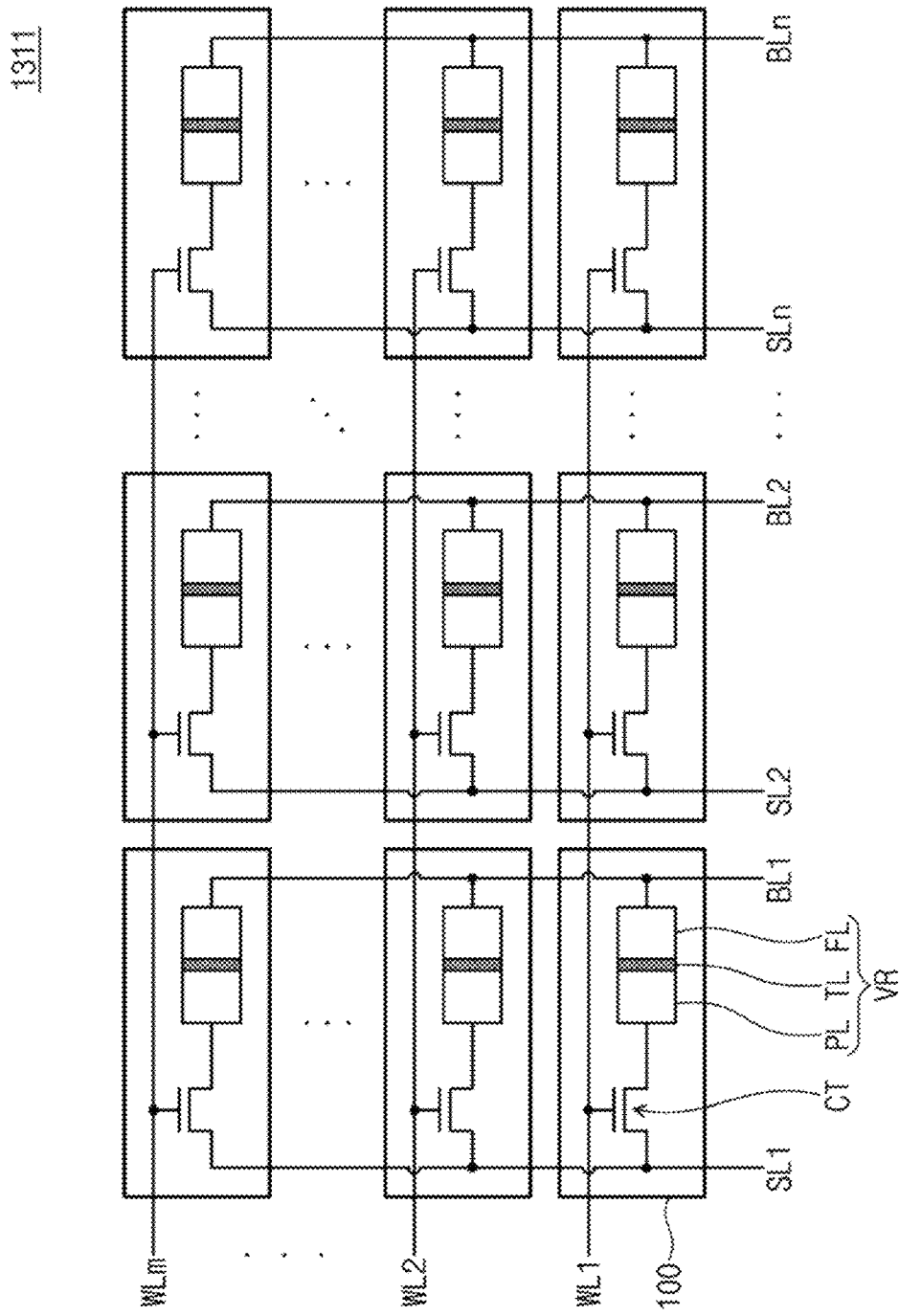
FIG. 3 is a block diagram illustrating a memory cell array of FIG. 2, according to an exemplary embodiment of the present inventive concept.

FIG. 3 is a block diagram illustrating the memory cell array 1311 of FIG. 2, according to an exemplary embodiment of the present inventive concept. For example, FIG. 3 illustrates a case where each memory cell MC of the memory cell array 1311 is implemented with an MRAM.

The memory cells MCs may be arranged along rows and columns, and may be connected to the word lines WL1, WL2, . . . WLm, the source lines SL1, SL2, . . . SLn, and the bit lines BL1, BL2, . . . BLn. The memory cell 100 may be one of the memory cells MCs, and may include a cell transistor CT and a variable resistance element VR. Other memory cells MCs may be configured substantially the same as the memory cell 100, and thus, redundant descriptions thereof will be omitted below for brevity.

A gate of the cell transistor CT may be connected to the word line WL1. The cell transistor CT and the variable resistance element VR may be connected in series between the source line SL1 and the bit line BL1. When the cell transistor CT is turned on based on a voltage of the word line WL1, a current path may be provided such that a current flows through the variable resistance element VR. For example, the variable resistance element VR may include a free layer FL, a tunneling layer TL, and a pinned layer PL.

Figure 4:
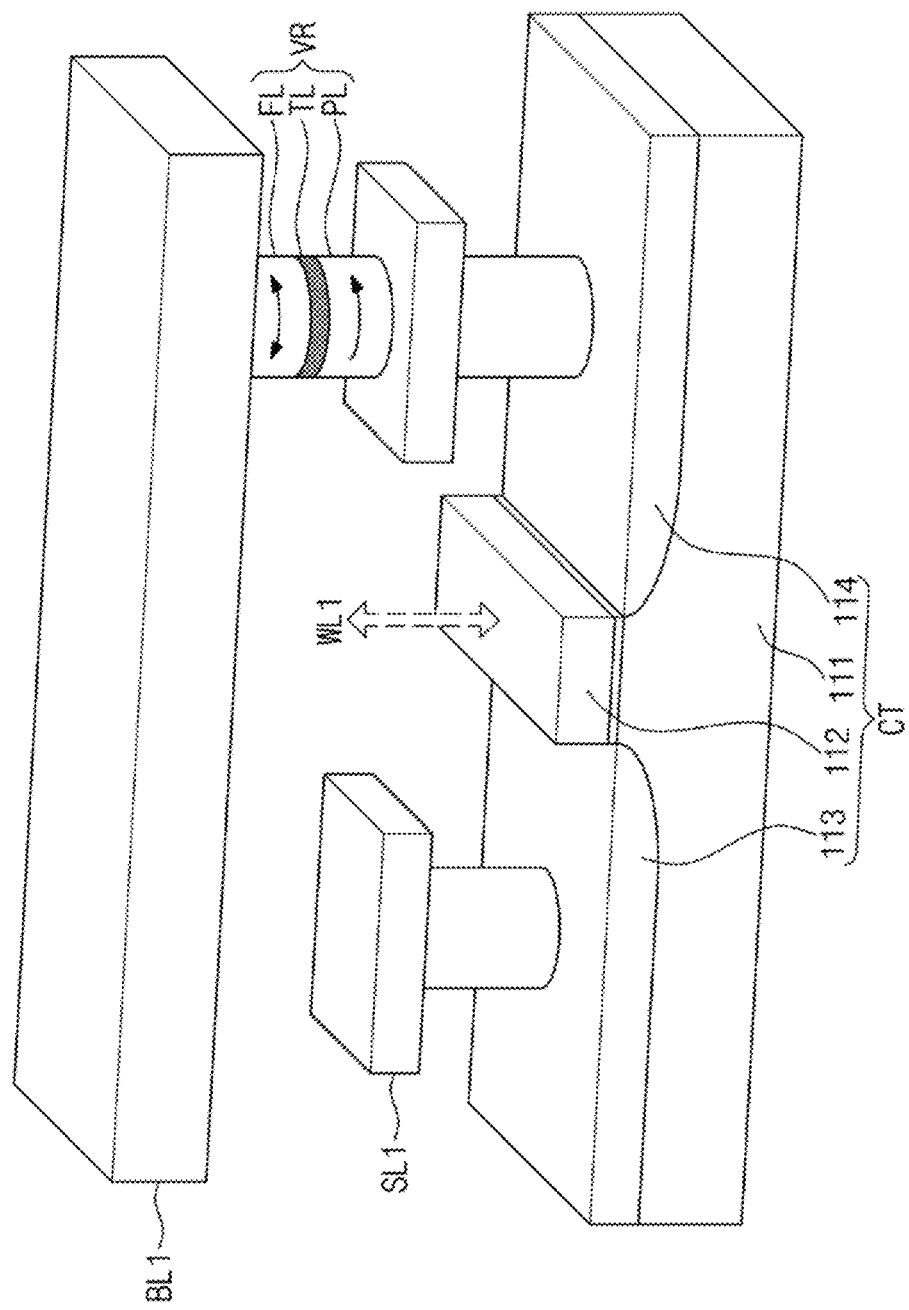
FIG. 4 is a diagram illustrating a memory cell of FIG. 3, according to an exemplary embodiment of the present inventive concept.

FIG. 4 is a diagram illustrating a configuration of the memory cell 100 of FIG. 3, according to an exemplary embodiment of the present inventive concept.

The cell transistor CT may include a body substrate 111, a gate 112, and junctions 113 and 114. The junction 113 may be formed on the body substrate 111, and may be connected to the source line SL1. The junction 114 may be formed on the body substrate 111, and may be connected to the bit line BL1 through the variable resistance element VR. The gate 112 may be formed on the body substrate 111 between the junctions 113 and 114, and may be connected to the word line WL1.

In the variable resistance element VR, the pinned layer PL and the free layer FL may include a magnetic material, and the tunneling layer TL may include an insulating material. A magnetization direction of the pinned layer PL may be pinned or fixed. A magnetization direction of the free layer FL may change depending on a direction of a current flowing through the variable resistance element VR. As the magnetization direction of the free layer FL changes, a resistance of the variable resistance element VR may change.

Figure 5:
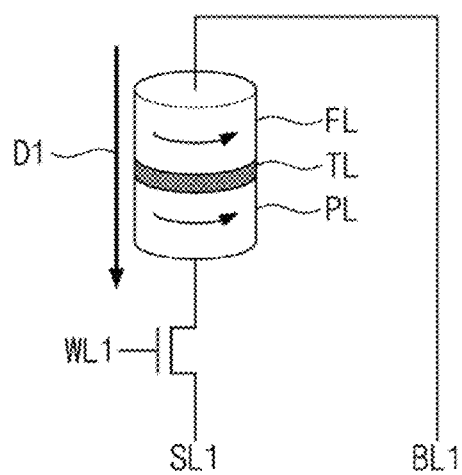
FIGS. 5 and 6 are diagrams for describing a characteristic of a memory cell of FIG. 3, according to an exemplary embodiment of the present inventive concept.
Figure 6:
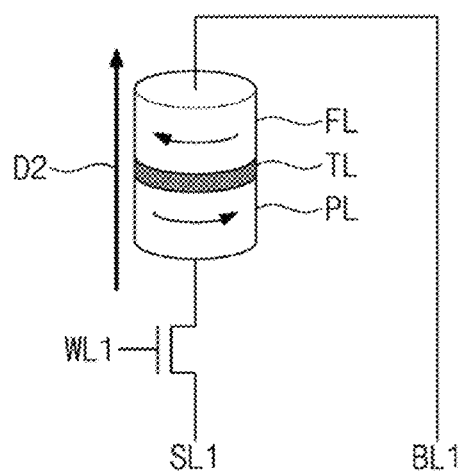

FIGS. 5 and 6 are diagrams for describing a characteristic of the memory cell 100 of FIG. 3, according to an exemplary embodiment of the present inventive concept.

For example, referring to FIG. 5, when a high voltage (e.g., a write voltage) is applied to the bit line BL1 and a low voltage (e.g., a ground voltage) is applied to the source line SL1, the write current may flow along a direction D1. In this case, the magnetization direction of the free layer FL may become identical to the magnetization direction of the pinned layer PL, and the resistance of the variable resistance element VR (or the memory cell 100) may decrease (e.g., enter a low resistance state).

Referring to FIG. 6, when a high voltage is applied to the source line SL1 and a low voltage is applied to the bit line BL1, the write current may flow along a direction D2. In this case, the magnetization direction of the free layer FL may become opposite to the magnetization direction of the pinned layer PL, and the resistance of the variable resistance element VR (or the memory cell 100) may increase (e.g., enter a high resistance state).

When the variable resistance element VR is in the low resistance state, the memory cell 100 may store data of a first value (e.g., logic "0"), On the other hand, when the variable resistance element VR is in the high resistance state, the memory cell 100 may store data of a second value (e.g., logic "1").

A data state of the memory cell 100 may be switched between the first value and the second value depending on a direction of the write current driven by the write driver 1314. For example, when the write current flows along the direction D2 while the memory cell 100 stores data of the first value, the first value of the data in the memory cell 100 may be switched to the second value. When the write current flows along the direction D1 while the memory cell 100 stores data of the second value, the second value of the data in the memory cell 100 may be switched to the first value.

Figure 7:
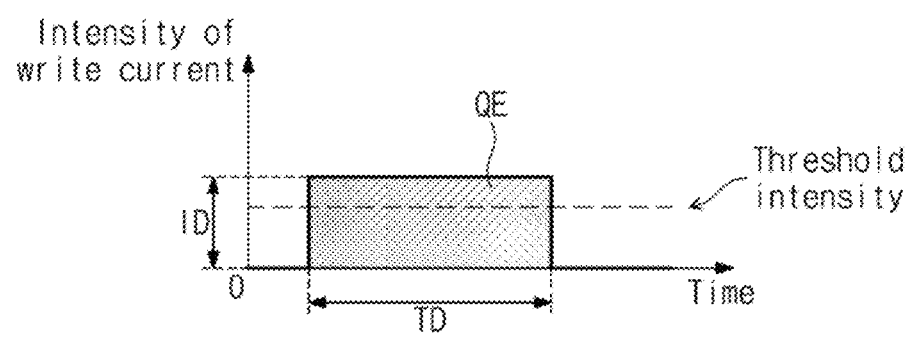
FIGS. 7 and 8 are graphs for describing a characteristic of a memory cell of FIG. 3, according to an exemplary embodiment of the present inventive concept.

FIG. 7 is a graph for describing a characteristic of the memory cell 100 of FIG. 3, according to an exemplary embodiment of the present inventive concept. The graph of FIG. 7 illustrates the intensity of the write current which is supplied from the write driver 1314 to the variable resistance element VR of the memory cell 100 as time elapses.

The write current may be supplied to the variable resistance element VR to change the data state of the memory cell 100. For example, the write driver 1314 may drive the write current having the intensity ID for a time length TD. In this case, energy corresponding to an amount of charges as much as an area QE may be supplied to the memory cell 100 to change the magnetization direction of the free layer FL of the variable resistance element VR.

For example, it is assumed that the energy corresponding to the area QE is the minimum energy required to change the magnetization direction of the free layer FL. When insufficient energy less than the energy corresponding to the area QE is supplied to the memory cell 100 (e.g., when the intensity of the write current is lower than the intensity ID or when the write current is driven for a time length shorter than the time length TD), the data state of the memory cell 100 may not be changed.

In addition, even though the intensity of the write current drops slightly below the intensity ID, when the time length TD for driving the write current increases, sufficient energy may be supplied, and thus, the data state of the memory cell 100 may be changed. However, when the intensity of the write current is lower than a threshold intensity, even though the time length TD becomes considerably longer, the data state of the memory cell 100 may not be changed. The threshold intensity may be the minimum intensity required to switch the data state, for example.

Figure 8:
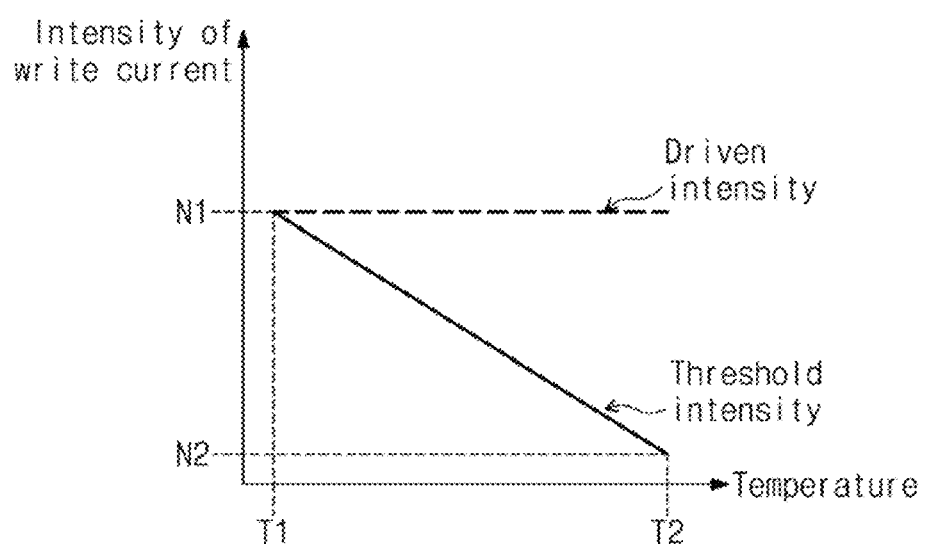

FIG. 8 is a graph for describing a characteristic of the memory cell 100 of FIG. 3, according to an exemplary embodiment of the present inventive concept. The graph of FIG. 8 illustrates the intensity of the write current which changes depending on temperature.

When the memory cell 100 is implemented with an MRAM, the threshold intensity of the write current for switching the data state of the memory cell 100 may change depending on a temperature of a condition in which the memory device 1310 operates. For example, when the memory device 1310 operates in a condition of a low temperature T1, the threshold intensity may be high. Accordingly, to switch the data state of the memory cell 100, the write driver 1314 should drive the write current of a high intensity N1.

On the other hand, when the memory device 1310 operates in a condition of a high temperature T2, the threshold intensity may be low. Accordingly, the write driver 1314 may drive the write current of a low intensity N2. Although the solid line (Threshold intensity) of FIG. 8 is provided to facilitate better understanding, and an actual relationship between the temperature and the threshold intensity may be nonlinear.

However, in some implementations of the present inventive concept, the write driver 1314 may be configured to drive only the write current of the high intensity N1 in a worst temperature condition. Therefore, the data state of the memory cell 100 is switchable in any temperature condition (refer to a broken line—Driven intensity). In such implementations, when the write current of the high intensity N1 is driven, even though the memory device 1310 actually operates in a high temperature condition, unnecessary power consumption may increase. Accordingly, adjusting the intensity of the write current based on a temperature of a condition in which the memory device 1310 operates may reduce power consumption.

The description for FIG. 8 is provided with regard to temperature, but the threshold intensity may be affected by an operation condition (e.g., a process error, a supply voltage, humidity, electromagnetic interference, and/or the like) other than temperature. Adjusting the write current based on an operation condition (other than or in addition to temperature) of the memory device 1310 may increase efficiency and reliability of operation and management of the memory device 1310, as well as to decrease power consumption.

In exemplary embodiments of the present inventive concept, the memory device 1310 may operate based on the write current suitable for a given operation condition, instead of operating based on the write current of the highest intensity required for the worst operation condition. These exemplary embodiments will be described with reference to FIGS. 9 to 18.

The following exemplary embodiments of the present inventive concept will be provided to describe the case where the memory device 1310 includes an MRAM, with regard to temperature. However, it is to be understood that the following exemplary embodiments may be variously changed or modified to drive the write current suitable for an operation condition other than temperature. In addition, it may also be understood that the following exemplary embodiments may be variously changed or modified for other types of memory, other than the MRAM, which may have a write current of a threshold intensity changing depending on an operation condition. The following exemplary embodiments of the present inventive concept are provided to facilitate better understanding, and are not intended to limit the present inventive concept.

Figure 9:
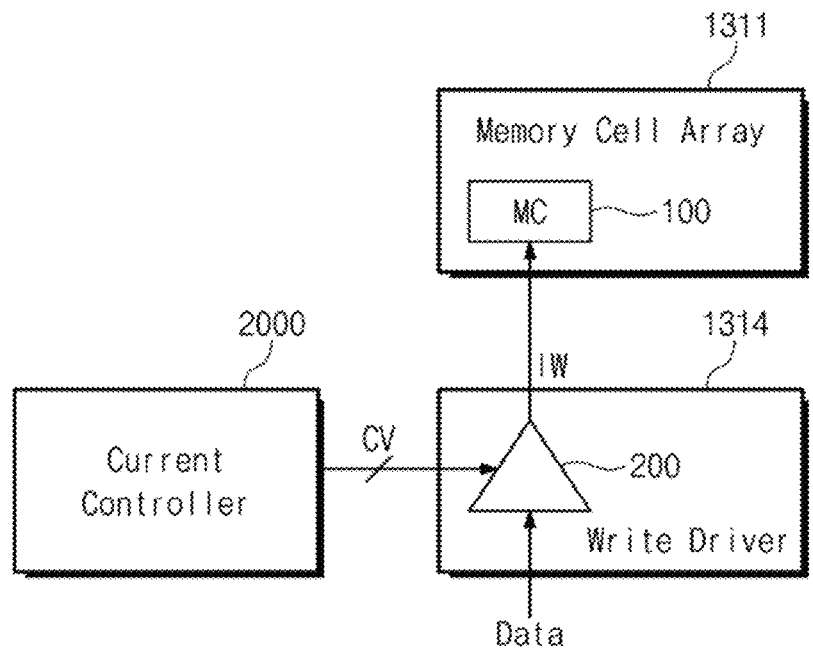
FIG. 9 is a block diagram illustrating a memory device of FIG. 1, according to an exemplary embodiment of the present inventive concept.

FIG. 9 is a block diagram illustrating the memory device 1310 of FIG. 1, according to an exemplary embodiment of the present inventive concept.

The memory cell array 1311 may include the memory cell 100. The memory cell 100 may store data based on a write current IW. Accordingly, the data may be stored in the memory cell array 1311 based on the write current IW.

The write driver 1314 may output the write current IW. For example, the write driver 1314 may include a driver circuit 200 configured to drive the write current IW to be provided to the memory cell 100. The write driver 1314 may use the driver circuit 200, to drive the write current IW based on the data buffered in the data buffer 1316. For example, when a data value stored in the memory cell 100 is different from a data value buffered in the data buffer 1316, the write driver 1314 may provide the write current IW to the memory cell 100 to switch the data state of the memory cell 100.

The current controller 2000 may be provided to adjust the intensity of the write current IW such that the intensity of the write current IW is suitable for an operation condition (e.g., an operation temperature) of the memory device 1310. The current controller 2000 may generate a control value CV. For example, the control value CV may be a digital code. The digital code may include digital bits each of which has a value of logic "0" or logic "1". However, a configuration of the control value CV is not limited to the digital code, and may be variously changed or modified to adjust the intensity of the write current IW.

The control value CV may be provided to the write driver 1314. The write driver 1314 may output the write current IW based on the control value CV. The write current IW may be driven such that the intensity of the write current IW is adjusted based on the control value CV.

Figure 10:
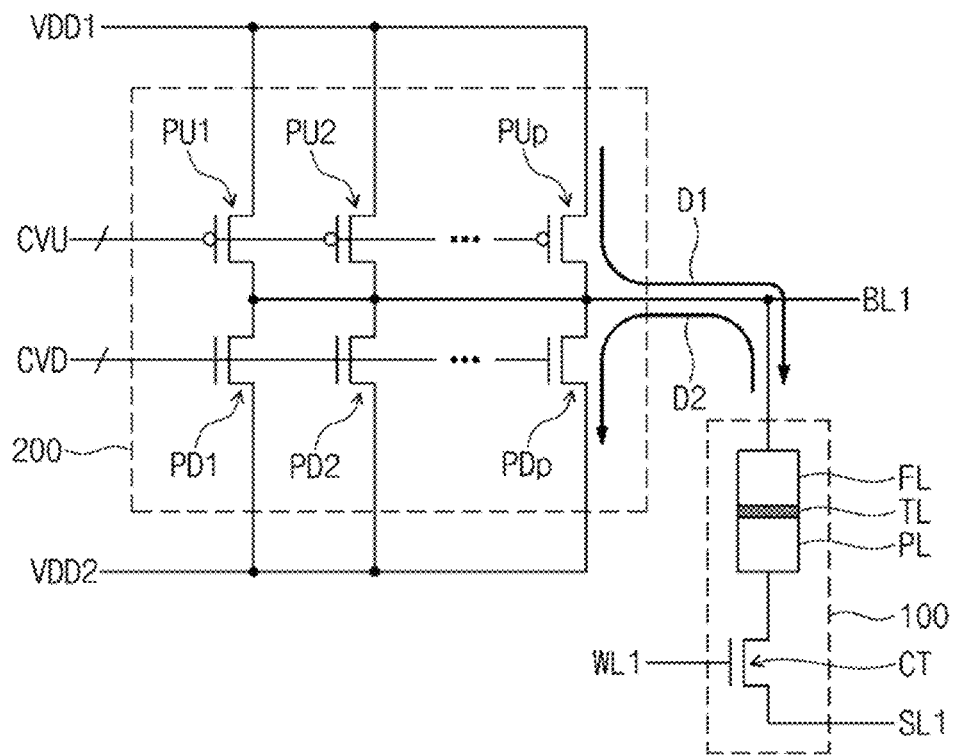
FIG. 10 is a block diagram illustrating a driver circuit and a memory cell of FIG. 9, according to an exemplary embodiment of the present inventive concept.

FIG. 10 is a block diagram illustrating the driver circuit 200 and the memory cell 100 of FIG. 9, according to an exemplary embodiment of the present inventive concept.

In exemplary embodiments of the present inventive concept, the driver circuit 200 may include transistors PU1, PU2, . . . PUp, and PD1, PD2, . . . PDp. The transistors PU1, PU2, . . . PUp may be connected between the bit line BL1 and a driving voltage VDD1. The transistors PD1, PD2, . . . PDp may be connected between the bit line BL1 and a driving voltage VDD2. For example, a level of the driving voltage VDD1 may be higher than a level of the driving voltage VDD2, and a level of a voltage of the source line SL1 may be between the level of the driving voltage VDD1 and the level of the driving voltage VDD2. The driving voltages VDD1 and VDD2 may be provided from a separate voltage generator circuit.

The driver circuit 200 may be connected to the memory cell 100. Additional driver circuits which are configured substantially the same as the driver circuit 200 may be respectively provided for remaining memory cells MCs other than the memory cell 100. For brevity, descriptions associated with the additional driver circuits will be omitted.

For example, the control value CV may include a control value CVU and a control value CVD. The control value CVU and the control value CVD may be included in the single control value CV or may be provided separately from each other. To facilitate better understanding, FIG. 10 illustrates that the control value CVU and the control value CVD are provided as separate control values.

Each of the transistors PU1, PU2, . . . PUp may be turned on or turned off based on the control value CVU. For example, when each of the transistors PU1, PU2, . . . PUp is a p-channel metal oxide semiconductor field effect transistor (MOSFET), each of the transistors PU1, PU2, . . . PUp may be turned on in response to a digital bit of logic "0" and may be turned off in response to a digital bit of logic "1".

Each of the transistors PD1, PD2, . . . PDp may be turned on or turned off based on the control value CVD. For example, when each of the transistors PD1, PD2, . . . PDp is an n-channel MOSFET, each of the transistors PD1, PD2, . . . PDp may be turned on in response to a digital bit of logic "1" and may be turned off in response to a digital bit of logic "0". However, it is to be understood that a configuration of the driver circuit 200 of FIG. 10 may be only one of possible examples and may be variously modified or changed to be different from the illustration of FIG. 10.

Turned-on transistors may provide a current path for the write current IW. Accordingly, the transistors PU1, PU2, . . . PUp and the transistors PD1, PD2, . . . PDp may drive the write current IW based on the control value CVU and the control value CVD.

For example, when one or more of the transistors PU1, PU2, . . . PUp are turned on and the transistors PD1, PD2, . . . PDp are turned off, a voltage of the bit line BL1 may be pulled up to the driving voltage VDD1. In this case, a current path from the bit line BL1 to the source line SL1 may be provided along the direction D1.

On the other hand, when the transistors PU1, PU2, . . . PUp are turned off and one or more of the transistors PD1, PD2, . . . PDp are turned on, the voltage of the bit line BL1 may be pulled down to the driving voltage VDD2. In this case, a current path from the source line SL1 to the bit line BL1 may be provided along the direction D2. The data state of the memory cell 100 may be switched depending on the directions D1 and D2 of the write current IW.

The number of turned-on transistors among the transistors PU1, PU2, . . . PUp may change based on digital bits of the control value CVU. The number of turned-on transistors among the transistors PD1, PD2, . . . PDp may change based on digital bits of the control value CVD. The intensity of the write current IW may change depending on the number of turned-on transistors.

As the number of turned-on transistors increases, the intensity of the write current IW may increase. The intensity of the write current IW may correspond to a sum of intensities of currents driven by the turned-on transistors. Accordingly, the intensity of the write current IW may be adjusted based on the control value CVU and the control value CVD.

Accordingly, the write driver 1314 may be configured to drive write currents having different intensities, by using the driver circuit 200. The intensity of the write current IW which flows along the direction D1 or the direction D2 through the memory cell 100 may be adjusted to have one of the different intensities provided by the write driver 1314.

Figure 11:
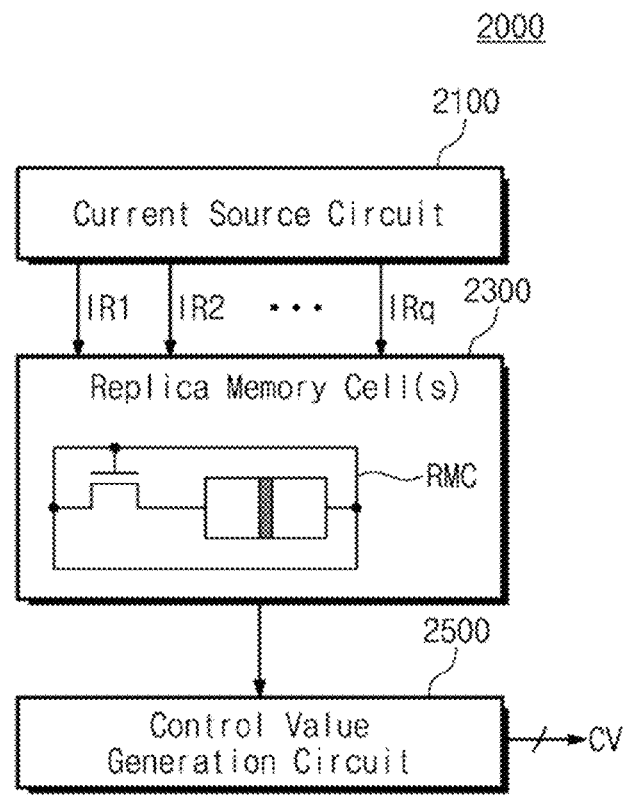
FIG. 11 is a block diagram illustrating a current controller of FIG. 9, according to an exemplary embodiment of the present inventive concept.
Figure 12:
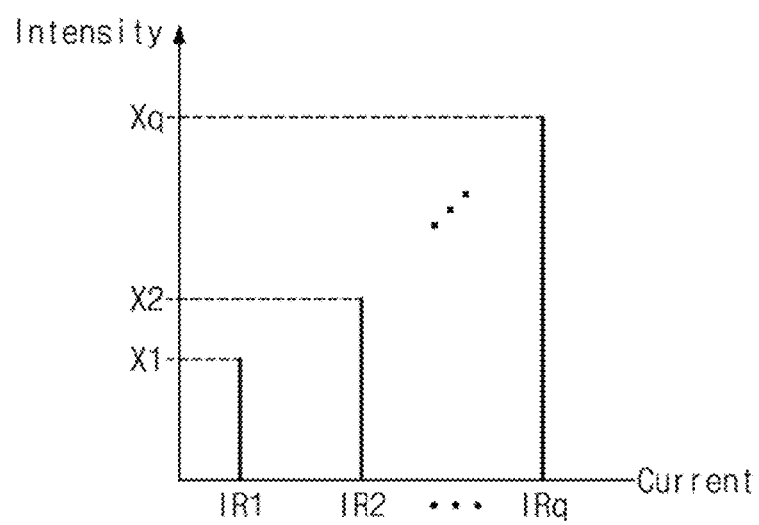
FIG. 12 is a graph for describing write currents of FIG. 11, according to an exemplary embodiment of the present inventive concept.

FIG. 11 is a block diagram illustrating the current controller 2000 of FIG. 9, according to an exemplary embodiment of the present inventive concept. FIG. 12 is a graph for describing write currents IR1, IR2, . . . IRq of FIG. 11, according to an exemplary embodiment of the present inventive concept.

Referring to FIG. 11, exemplary embodiments of the present inventive concept, the current controller 2000 may include a current source circuit 2100, one or more replica memory cell(s) 2300, and a control value generation circuit 2500. The current source circuit 2100 may output the write currents IR1, IR2, . . . IRq having different intensities.

Referring to FIG. 12, the write current IR1 may have an intensity X1. The write current IR2 may have an intensity X2, and the write current IRq may have an intensity Xq. The intensities X1, X2, and Xq may be different from one another.

Returning to FIG. 11, the replica memory cell(s) 2300 may include a replica memory cell RMC. The number of replica memory cells included in the replica memory cell(s) 2300 may be variously changed or modified, which will be more fully described below. When the replica memory cell(s) 2300 includes a plurality of replica memory cells, each of the plurality of replica memory cells may be configured substantially identical or similar to the replica memory cell RMC.

The replica memory cell RMC may be configured by replicating a memory cell (e.g., the memory cell 100) included in the memory cell array 1311. The replica memory cell RMC may include components identical to components included in the memory cell 100.

Characteristics (e.g., an element size, a physical shape, a voltage/current response, and/or the like) of the components included in the replica memory cell RMC may be identical to characteristics of the components included in the memory cell 100. Connections between the components included in the replica memory cell RMC may be identical to connections between the components included in the memory cell 100. For example, when the memory cell 100 is implemented with an MRAM, the replica memory cell RMC may have the configurations and the characteristics described with reference to FIGS. 3 to 8.

The write currents IR1, IR2, . . . IRq may be supplied to the replica memory cell(s) 2300. The replica memory cell RMC may be configured to store data based on the write currents IR1, IR2, . . . IRq. For example, when the replica memory cell RMC is implemented with an MRAM, a data state of the replica memory cell RMC may be switched or may be maintained without switching, depending on directions of the write currents IR1, IR2, . . . IRq.

In addition, a threshold intensity of a write current required to switch the data state of the replica memory cell RMC may change depending on an operation condition (e.g., an operation temperature). The state of the data stored in the replica memory cell RMC may be switched between the first value and the second value when the intensity of the write current supplied to the replica memory cell RMC is greater than or equal to the threshold intensity.

Intensities of some of the write currents IR1, IR2, . . . IRq may not be sufficient (e.g., they may be too low) to change the data state of the replica memory cell RMC. On the other hand, intensities of some of the write currents IR1, IR2, . . . IRq may be sufficiently high to change the data state of the replica memory cell RMC.

Accordingly, the write currents IR1, IR2, . . . IRq having the different intensities may be used to determine a current intensity which is sufficient to change the data state of the replica memory cell RMC. For example, in a given operation condition, when the data state of the replica memory cell RMC is not switched based on the write current IR1 and is switched based on the write current IR2, it may be determined that the intensity X1 is insufficient and the intensity X2 is sufficient. In the case just described, the threshold intensity may be between the intensity X1 and the intensity X2.

The replica memory cell RMC may be configured by replicating the memory cell 100. Accordingly, when the intensity X2 of the write current IR2 is sufficient to change the data state of the replica memory cell RMC, the intensity X2 of the write current IR2 may also be sufficient to change the data state of the memory cell 100.

As such, the write currents IR1, IR2, . . . IRq and the replica memory cell(s) 2300 may be provided to determine the intensity of the write current IW which is suitable to store data in the memory cell(s) MC of the memory cell array 1311 in a given operation condition. The intensity of the write current IW which is suitable to store data in a memory cell MC under a particular condition, may correspond to a write current that is optimal for switching the current data state of the memory cell MC. When a temperature (or another factor) of a condition in which the memory device 1310 operates changes, the threshold intensity of the write current IW may change. Accordingly, in exemplary embodiments of the present inventive concept, when an operation condition of the memory device 1310 changes, the intensity of the write current IW may be adjusted based on the write currents IR1, IR2, . . . IRq and the replica memory cell(s) 2300.

To adjust the intensity of the write current IW, the control value generation circuit 2500 may generate the control value CV. The control value CV may be associated with an intensity of a write current, which may switch states of data stored in the replica memory cell(s) 2300, among the write currents IR1, IR2, . . . IRq. The write current which switches states of data stored in the replica memory cell(s) 2300 may be referred to as a switch write current. The control value CV may be provided to the write driver 1314 such that the write driver 1314 drives the write current IW having the intensity of the switch write current.

The control value generation circuit 2500 may sense whether the states of the data stored in the replica memory cell(s) 2300 have been switched based on the write currents IR1, IR2, . . . IRq. The control value generation circuit 2500 may determine the switch write current which switches the states of the data stored in the replica memory cell(s) 2300, based on the sensed states. The control value CV may be generated corresponding to the intensity of the determined switch write current. Accordingly, the control value generation circuit 2500 may generate the control value CV based on the states of the data stored in the replica memory cell(s) 2300.

A digital bit of the control value CV may be determined based on whether the states of the data stored in the replica memory cell(s) 2300 have been switched. For example, when a data state of a replica memory cell (e.g., the replica memory cell RMC) is switched, the digital bit of the control value CV may have a value of logic "1". On the other hand, when the data state of the replica memory cell RMC is not switched, the digital bit of the control value CV may have a value of logic "0".

Accordingly, the control value CV may be associated with the intensity of the switch write current. The write driver 1314 may drive the write current IW through the transistors PU1, PU2, . . . PUp, and PD1, PD2, . . . PDp of the driver circuit 200 such that the intensity of the write current IW is adjusted to correspond to the intensity of the switch write current based on the control value CV.

Therefore, the intensity of the write current IW may be adjusted (e.g., to be greater than or equal to the threshold intensity) such that a state of data stored in the memory cell array 1311 is switched based on the write current IW in a given operation condition (e.g., an operation temperature) of the memory device 1310. However, the intensity of the write current IW may be smaller than or equal to the maximum intensity among the different intensities which are provided b the driver circuit 200.

In some cases, several write currents among the write currents IR1, IR2, . . . IRq may switch the data states of the replica memory cell(s) 2300. For example, when the threshold intensity is between the intensity X1 and the intensity X2, the write currents IR2 and IRq except for the write current IR1 may switch the data states of the replica memory cell(s) 2300. In this example, in terms of reducing power consumption, driving a write current of the low intensity X2 may be more advantageous than driving a write current of the high intensity Xq. In other words, it may be advantageous to drive the write current IW having the lowest intensity among write currents having intensities greater than or equal to the threshold intensity.

In exemplary embodiments of the present inventive concept, the control value generation circuit 2500 may generate the control value CV with regard to the lowest intensity among intensities of write currents which may switch the data states of the replica memory cell(s) 2300. Accordingly, based on the control value CV, the write driver 1314 may output the write current IW having the minimum intensity which may switch data states of the memory cells MCs.

Accordingly, the write driver 1314 may drive the write current IW having an intensity which is optimal for a given operation condition, instead of driving only a write current of a high intensity. Accordingly, unnecessary power consumption may decrease, and efficiency and reliability may be increased.

Figure 13:
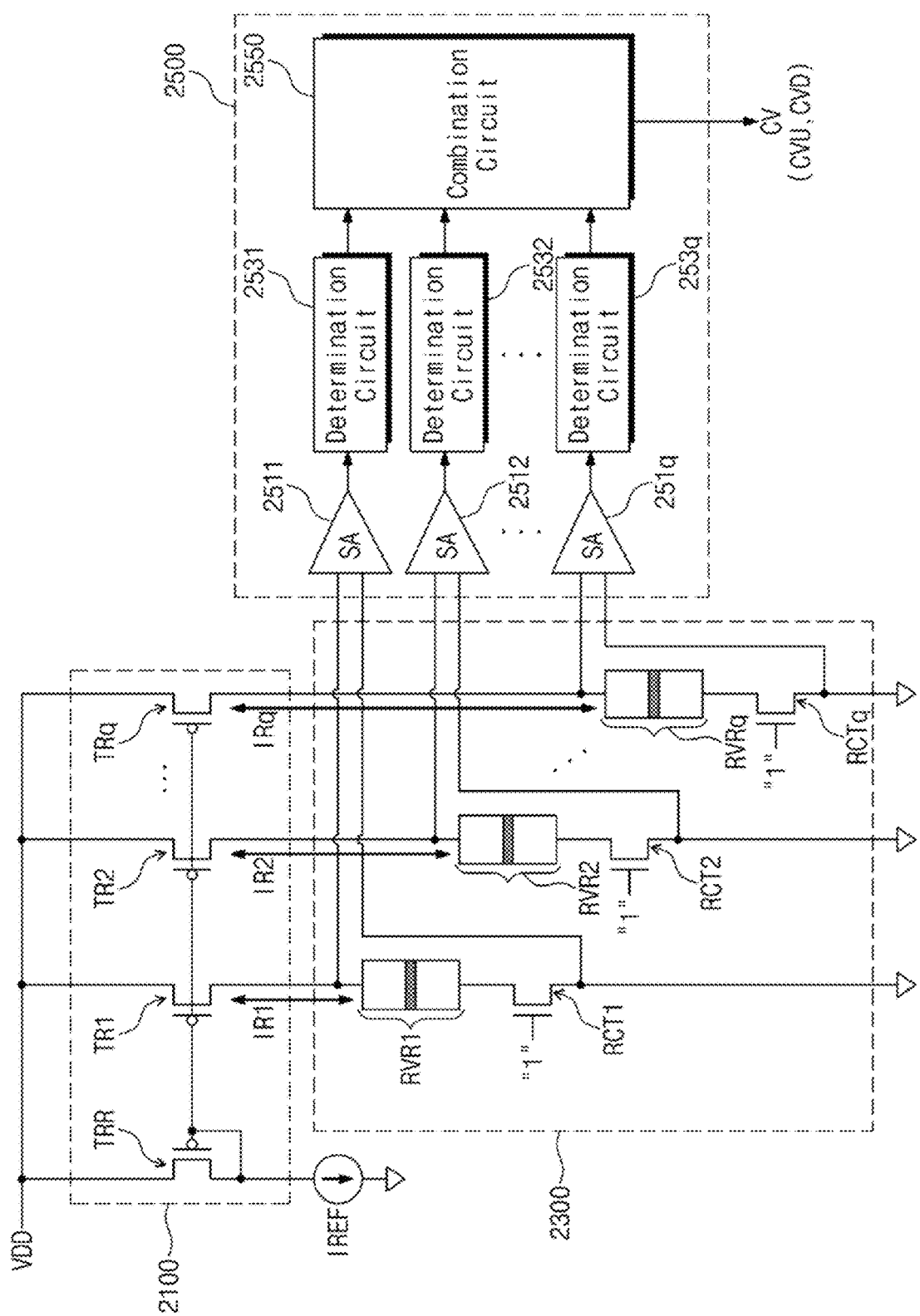
FIG. 13 is a block diagram illustrating a current controller of FIG. 11, according to an exemplary embodiment of the present inventive concept.

FIG. 13 is a block diagram illustrating the current controller 2000 of FIG. 11, according to an exemplary embodiment of the present inventive concept.

In exemplary embodiments of the present inventive concept, the current source circuit 2100 may include transistors TRR, TR1, TR2, . . . TRq. The transistor TRR may drive a reference current IREF based on a driving voltage VDD. For example, the reference current IREF may be provided from a circuit, which is capable of providing a reference current level, such as a bandgap reference (BGR) circuit, and the driving voltage VDD may be provided from a separate voltage generation circuit. The transistors TR1, TR2, . . . TRq may output the write currents IR1, IR2, . . . IRq having the different intensities based on the driving voltage VDD.

A gate of the transistor TRR may be connected with a source of the transistor TRR, and gates of the transistors TR1, TR2, . . . TRq may be connected to the gate of the transistor TRR. This may provide a current mirror structure. In the current mirror structure, the transistors TR1, TR2, . . . TRq may drive the write currents IR1, IR2, . . . IRq by copying the reference current IREF according to mirroring ratios.

The transistors TR1, TR2, . . . TRq may have different sizes (e.g., channel widths), As a channel width of a transistor becomes larger, an intensity of a current to be driven by the transistor may increase. For example, when channel widths of the transistors TR1 and TR2 are configured to be smaller than the channel width of the transistor TRq, the intensity Xq of the write current IRq may be higher than the intensities X1 and X2 of the write currents IR1 and IR2. Accordingly, the intensities IR1, IR2, . . . IRq of the write currents may be different from one another.

The mirroring ratios may correspond to ratios between the intensity of the reference current IREF and the intensities of the write currents IR1, IR2, . . . IRq. The write currents IR1, IR2, . . . IRq may be generated by copying the reference current IREF depending on the different ratios. The intensities of the write currents IR1, IR2, . . . IRq may correspond to the different ratios.

In exemplary embodiments of the present inventive concept, the replica memory cell(s) 2300 may include a plurality of replica memory cells. A first replica memory cell may include a replica variable resistance element RVR1 and a replica cell transistor RCT1, a second replica memory cell may include a replica variable resistance element RVR2 and a replica cell transistor RCT2, and a q-th replica memory cell may include a replica variable resistance element RVRq and a replica cell transistor RCTq. Each replica memory cell may be configured by replicating the memory cell MC of the memory cell array 1311.

The write currents IR1, IR2, . . . IRq may be respectively supplied to the replica memory cells connected to the transistors TR1, TR2, . . . TRq. The replica memory cells may store data based on the respective write currents IR1, IR2, . . . IRq. States of the data stored in the replica memory cells may be switched or may be maintained without switching, depending on the respective write currents IR1, IR2, . . . IRq. The replica cell transistors RCT1, RCT2, . . . RCTq may be turned on to provide current paths.

For example, when the threshold intensity is between the intensity X1 and the intensity X2 in a given operation condition (e.g., an operation temperature), the intensity X1 of the write current IR1 may not be sufficient (e.g., it may be too low) to switch a data state. Accordingly, a data state of the replica memory cell including the replica variable resistance element RVR1 may be maintained without switching.

On the other hand, the intensities X2 . . . Xq of the write currents IR2 . . . IRq are greater than or equal to the threshold intensity, and may be sufficiently high to switch the data state. Accordingly, data states of the replica memory cells including the replica variable resistance elements RVR2 . . . RVRq may be switched based on the respective write currents IR2 . . . IRq.

In exemplary embodiments of the present inventive concept, the control value generation circuit 2500 may include replica sense amplifiers 2511, 2512, . . . 251$q$, determination circuits 2531, 2532, . . . 253$q$, and a combination circuit 2550. The replica sense amplifiers 2511, 2512, . . . 251$q$ may sense data stored in the respective replica memory cells. For example, each of the replica sense amplifiers 2511, 2512, . . . 251$q$ may be configured substantially identical or similar to the sense amplifier 1315. The replica sense amplifiers 2511, 2512, . . . 251$q$ may output the sensed data values.

The determination circuits 2531, 2532, . . . 253$q$ may determine, based on the output values of the replica sense amplifiers 2511, 2512, . . . 251$q$, whether the data states of the respective replica memory cells are switched based on the write currents IR1, IR2, . . . IRq. For example, the determination circuits 2531, 2532, . . . 253$q$ may be implemented with a hardware circuit (e.g., a level detector, a phase detector, flip-flops, and/or the like) configured to detect a change or a transition of a data value. The determination circuits 2531, 2532, . . . 253$q$ may output values corresponding to results of the determination.

For example, the replica sense amplifier 2511 may sense data of the replica memory cell including the replica variable resistance element RVR1. The determination circuit 2531 may determine, based on the output of the replica sense amplifier 2511, whether a data state of the replica memory cell including the replica variable resistance element RVR1 is switched based on the write current IR1. The replica sense amplifiers 2512 . . . 251$q$ and the determination circuits 2532 . . . 253$q$ may operate in a similar manner.

The combination circuit 2550 may generate the control value CV including the control value CVU and the control value CVD (or may generate the control value CVU and the control value CVD separately), based on the output values of the determination circuits 2531, 2532, ... 253q. Accordingly, the control value CV may be generated based on whether the data states of the replica memory cells are switched. The combination circuit 2550 may be implemented with a hardware circuit (e.g., logic gates, flip-flops, and/or the like) configured to generate the control value CV by combining the output values of the determination circuits 2531, 2532, ... 253q.

The write current IW driven by the write driver 1314 may have the intensity which is adjusted based on the control value CV. The control value CV may be generated such that the control value CV is associated with the intensity of the switch write current which switches the data states of the replica memory cells. Accordingly, the write current IW may be driven to have the intensity corresponding to the intensity of the switch write current.

For example, it may be determined that only the data state of the replica memory cell including the replica variable resistance element RVRq is switched based on the write current having the highest intensity Xq (see FIG. 12) and data states of remaining replica memory cells are not switched. In this case, the control value CV may be generated to adjust the intensity of the write current IW such that the intensity of the write current IW corresponds to the intensity of Xq (see FIG. 12), and the write driver 1314 may drive the write current IW having the intensity corresponding to the intensity of Xq (see FIG. 12) based on the control value CV.

As another example, only the data state of the replica memory cell including the replica variable resistance element RVR1 may be maintained without switching, and the data states of the remaining replica memory cells may be switched based on the respective write currents IR2 ... IRq. When it is determined that data states of several replica memory cells are switched, a write current (e.g., the write current IR2) having the lowest intensity (e.g., the intensity X2 in FIG. 12) of the write currents IR2 ... IRq supplied to the replica memory cells may be determined as the switch write current.

The control value CV may be generated to adjust the intensity of the write current IW such that the intensity of the write current IW corresponds to the intensity (e.g., the intensity X2 in FIG. 12) of the determined switch write current. Accordingly, based on the control value CV, the write driver 1314 may drive the write current IW which has an intensity greater than or equal to the threshold intensity but has the minimum intensity capable of switching the data states of the memory cells MCs.

However, the illustration of FIG. 13 is provided to facilitate better understanding, and is not intended to limit the present inventive concept. It is to be understood that various exemplary embodiments of the present inventive concept may be obtained by making modifications to the illustration of FIG. 13.

In exemplary embodiments of the present inventive concept, the number of the transistors TR1, TR2, ... TRq may be identical to or different from the number of replica memory cells. When the number of the transistors TR1, TR2, ... TRq is smaller than the number of replica memory cells, one write current may be supplied to several replica memory cells. When the number of the transistors TR1, TR2, ... TRq is greater than the number of replica memory cells, one replica memory cell may be tested based on several write currents. For example, when only one replica memory cell is provided, it may be tested to determine whether a data state of the one replica memory cell is switched based on all the write currents IR1, IR2, ... IRq.

In exemplary embodiments of the present inventive concept, the transistors TR1, TR2, ... TRq may be configured to have the same channel width. In addition, a plurality of replica memory cells may be configured to have different resistance values. In this case, the write currents IR1, IR2, ... IRq may have different intensities based on the different resistance values.

In exemplary embodiments of the present inventive concept, the control value generation circuit 2500 may not include the determination circuits 2531, 2532, ... 253q and the combination circuit 2550. In this case, the output values of the replica sense amplifiers 2511, 2512, ... 251q may be provided as the control value CV. When configurations associated with the replica memory cell(s) 2300 and the driver circuit 200 are suitably designed, the determination circuits 2531, 2532, ... 253q and the combination circuit 2550 may be excluded, and thus, circuit complexity may decrease.

The present inventive concept is not limited to the above exemplary embodiments, and the current source circuit 2100, the replica memory cell(s) 2300, and the control value generation circuit 2500 may be variously changed or modified to provide the operations described in the present inventive concept. In addition, the current controller 2000 may be variously changed or modified to generate the control value CV based on a write current which switches a data state of a replica memory cell.

Generating the control value CV and adjusting the intensity of the write current IW by the current controller 2000 may be continuously performed during an operation of the memory device 1310, periodically (e.g., every ten seconds), or in response to a condition being satisfied (e.g., a temperature change exceeding a reference value). The present inventive concept is not limited thereto, and exemplary embodiments may be variously changed or modified to drive the write current IW suitable for an operation condition.

Figure 14:
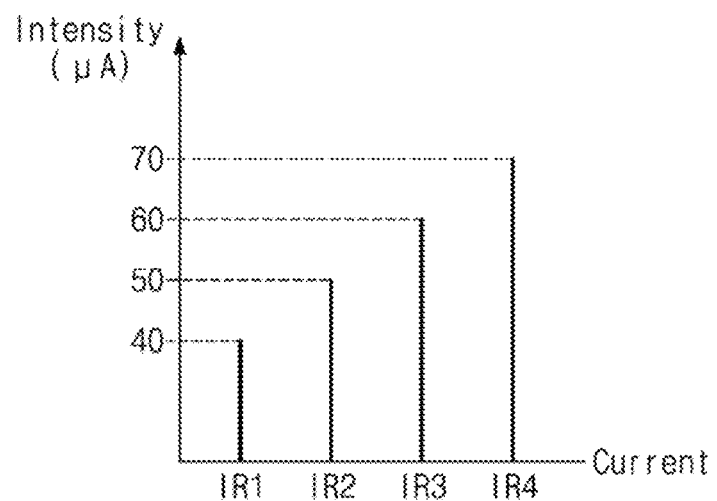
FIG. 14 is a graph for describing an operation of a current controller of FIG. 11, according to an exemplary embodiment of the present inventive concept.
Figure 15:
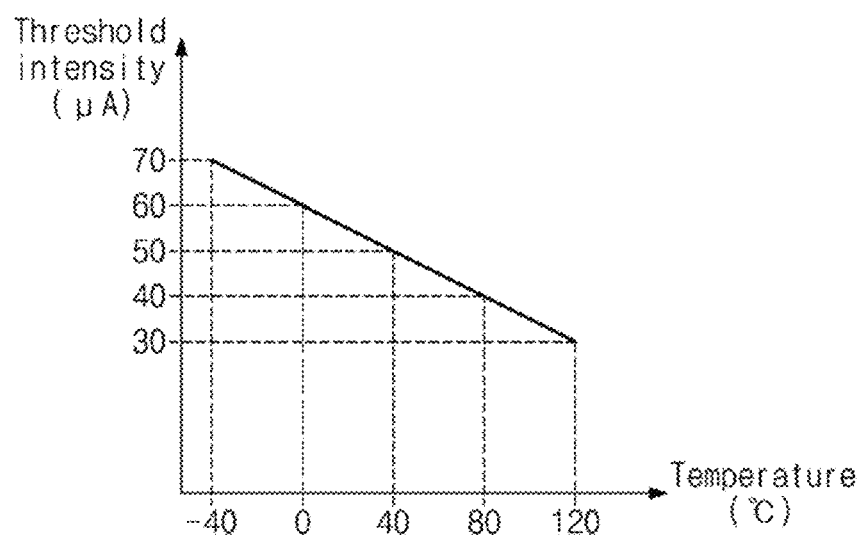
FIG. 15 is a graph for describing a characteristic of a memory cell of FIG. 9, according to an exemplary embodiment of the present inventive concept.

FIG. 14 is a graph for describing an operation of the current controller 2000 of FIG. 11, according to an exemplary embodiment of the present inventive concept. FIG. 15 is a graph for describing a characteristic of the memory cell 100 of FIG. 9, according to an exemplary embodiment of the present inventive concept.

Referring to FIG. 14, the current source circuit 2100 may output four write currents IR1, IR2, IR3, and IR4. Intensities of the write currents IR1, IR2, IR3, and IR4 may be selected taking into account a threshold intensity characteristic of the memory cells MC. For example, the intensities of the write currents IR1, IR2, IR3, and IR4 may be 40 µA, 50 µA, 60 µA, and 70 µA respectively.

Referring to FIG. 15, for example, the memory device 1310 may be operable in a temperature condition between −40° C. and 120° C. For example, when the memory device 1310 operates at −40° C., the threshold intensity of the write current IW may be 70 µA. For example, when the memory device 1310 operates at 120° C., the threshold intensity of the write current IW may be 30 µA. In FIG. 15, there is a linear relationship between the temperature and the threshold intensity.

Figure 16:
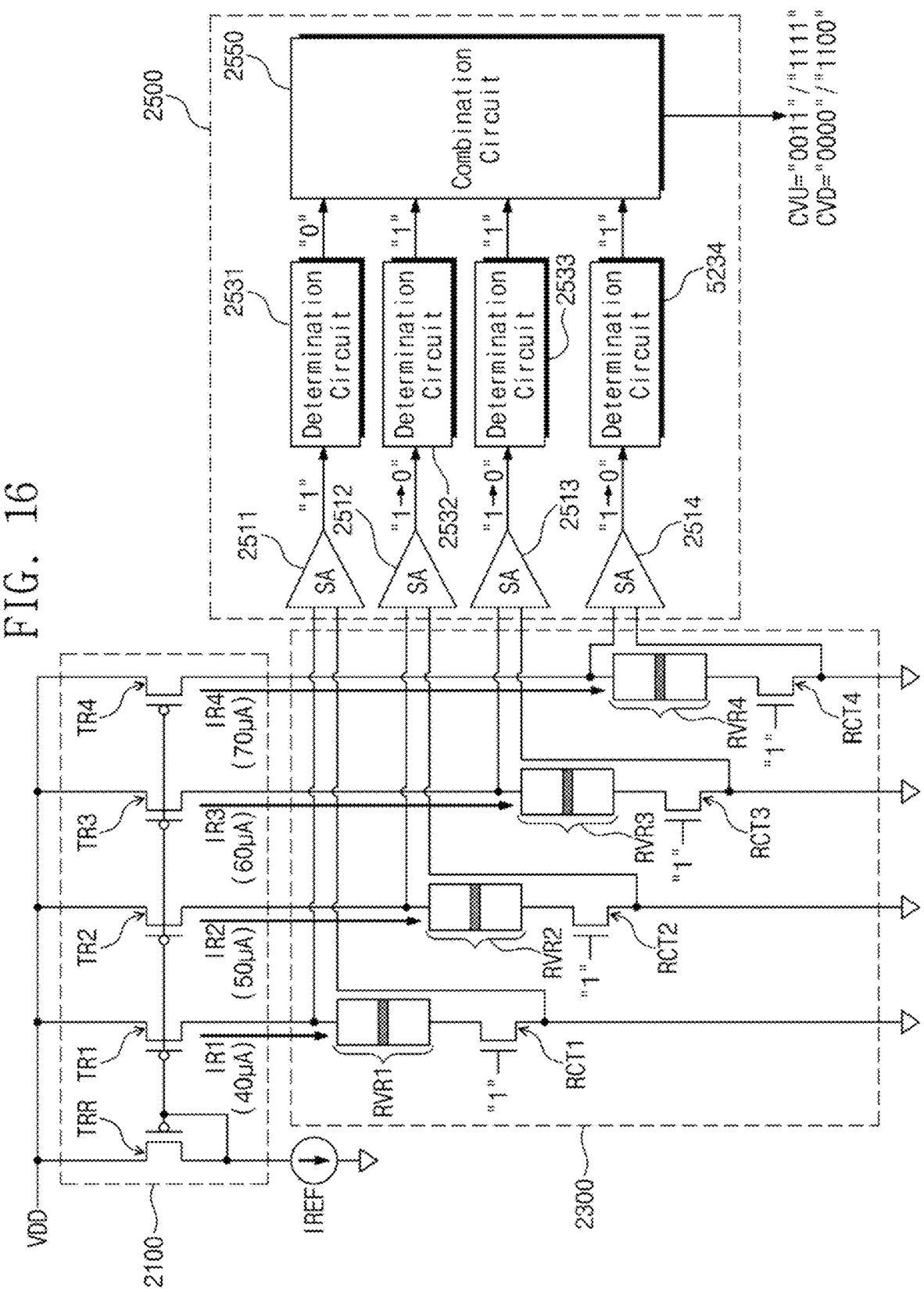
FIG. 16 is a block diagram for describing a configuration and an operation of a current controller of FIG. 13 according to examples of FIGS. 14 and 15.

FIG. 16 is a block diagram for describing a configuration and an operation of the current controller 2000 of FIG. 13 according to the examples of FIGS. 14 and 15.

To facilitate better understanding, for example, it is assumed that the memory device 1310 operates at 60° C.

Under this assumption, referring to FIG. 15, the threshold intensity for switching the data states of replica memory cells and the memory cells MC may be 45 µA. In addition, for example, it is assumed that the replica memory cells store a data value of logic "1" initially.

The write currents IR1, IR2, IR3, and IR4 driven by transistors TR1, TR2, TR3, and TR4 may be supplied to the replica memory cells. When the threshold intensity is 45 µA, a data state of a replica memory cell including a replica variable resistance element RVR1 and a replica cell transistor RCT1 may not be switched even though the write current IR1 is supplied. Accordingly, a replica sense amplifier 2511 may sense a data value of logic "1".

On the other hand, data states of replica memory cells including replica variable resistance elements RVR2, RVR3, and RVR4 and replica cell transistors RCT2, RCT3, and RCT4 may be switched from a data value of logic "1" to a data value of logic "0", based on the write currents IR2, IR3, and IR4. Accordingly, replica sense amplifiers 2512, 2513, and 2514 may sense a data value of logic "0".

When an output value of the replica sense amplifier 2511 does not change, a determination circuit 2531 may output a value (e.g., logic "0") indicating that the data state of the replica memory cell including the replica variable resistance element RVR1 and the replica cell transistor RCT1 is not switched. In response to a change or a transition of the output values of the replica sense amplifiers 2512, 2513, and 2514, the determination circuits 2532, 2533, and 2534 may output values (e.g., values of logic "1") indicating that the data states of the replica memory cells including the replica variable resistance elements RVR2, RVR3, and RVR4 and the replica cell transistors RCT2, RCT3, and RCT4 are switched.

The combination circuit 2550 may combine the output values of the determination circuits 2531, 2532, 2533, and 2534 to generate the control value CVU and the control value CVD. The control value CVU and the control value CVD may be generated such that the control value CVU and the control value CVD are associated with the lowest intensity 50 µA among the intensities 50 µA, 60 µA, and 70 µA which may switch the data states of the replica memory cells.

For example, the control value CVU may include digital bits of "0011" and digital bits of "1111", and the control value CVD may include digital bits of "0000" and digital bits of "1100". The combination circuit 2550 may include a combinational logic circuit to combine the digital bits of the control value CVU and the control value CVD.

Figure 17:
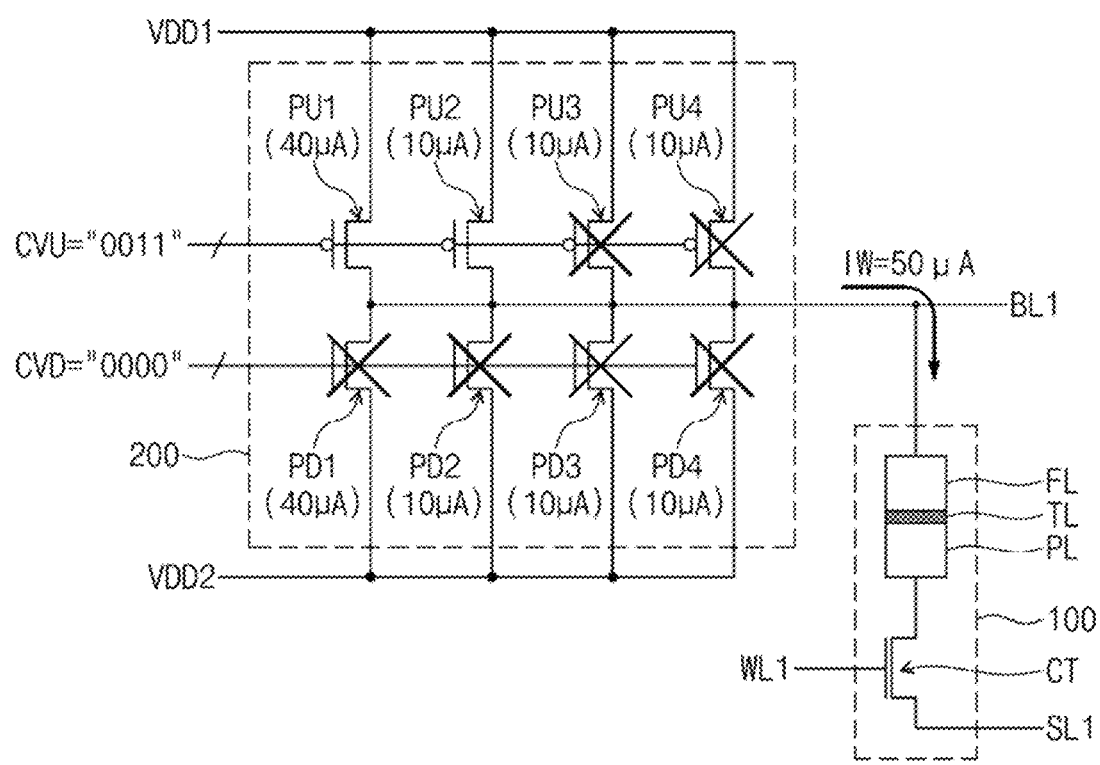
FIGS. 17 and 18 are block diagrams for describing a configuration and an operation of a driver circuit of FIG. 10, which operates based on a control value output from a current controller of FIG. 16, according to an exemplary embodiment of the present inventive concept.
Figure 18:
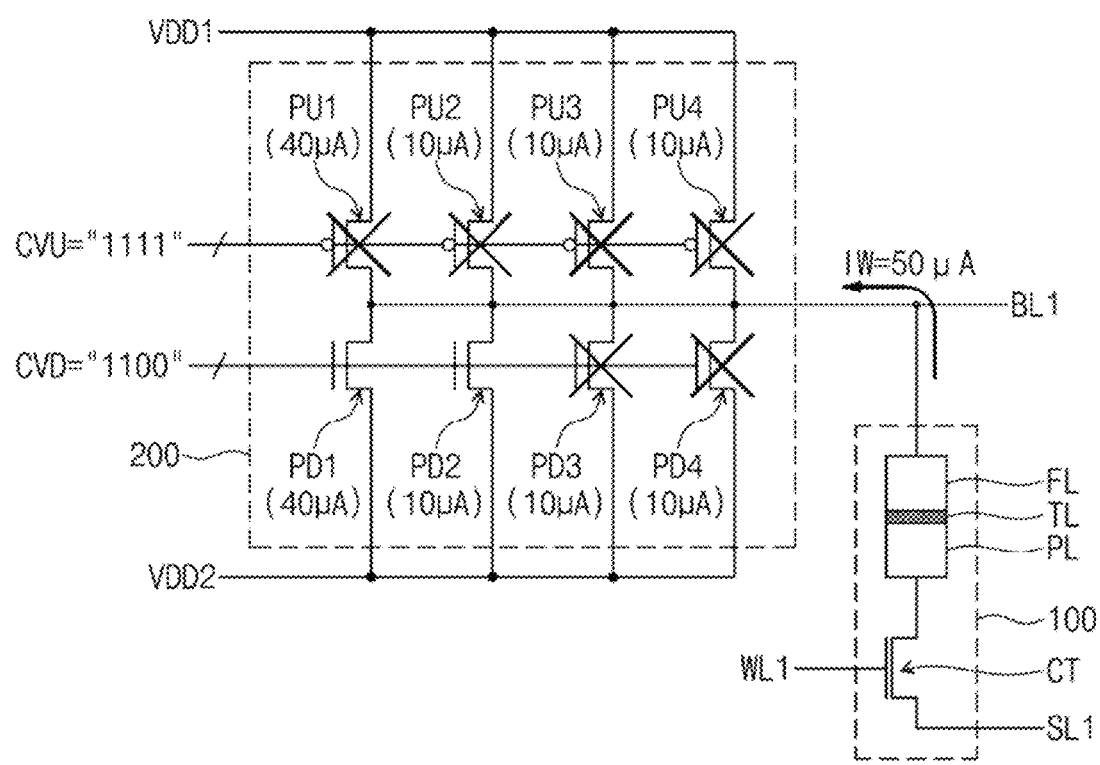

FIGS. 17 and 18 are block diagrams for describing a configuration and an operation of the driver circuit 200 of FIG. 10 which operates based on the control value CV output from the current controller 2000 of FIG. 16, according to an exemplary embodiment of the present inventive concept.

Referring to FIGS. 17 and 18, the driver circuit 200 may include transistors PU1, PU2, PU3, and PU4 and transistors PD1, PD2, PD3, and PD4. For example, each of the transistors PU1 and PD1 may have a channel width for driving a current of 40 µA, and each of the transistors PU2, PU3, PU4, PD2, PD3, and PD4 may have a channel width for driving a current of 10 µA.

For example, FIG. 17 may be associated with a case where the driver circuit 200 is intended to pull up the voltage of the bit line BL1 to the driving voltage VDD1. In the case of FIG. 17, the driver circuit 200 may receive the control value CVU of "0011" and the control value CVD of "0000" from the control value generation circuit 2500.

Referring to FIG. 17, the transistors PD1, PD2, PD3, and PD4 may be turned off in response to the digital bits "0000" of the control value CVD. The transistors PU1 and PU2 may be turned on in response to the upper digital bits "00" of the control value CVU. The transistors PU3 and PU4 may be turned off in response to the lower digital bits "11" of the control value CVU. Accordingly, the write current IW of 50 µA may be driven through the turned-on transistors PU1 and PU2.

For example, FIG. 18 may be associated with a case where the driver circuit 200 is intended to pull down the voltage of the bit line BL1 to the driving voltage VDD2. In the case of FIG. 18, the driver circuit 200 may receive the control value CVU of "1111" and the control value CVD of "1100" from the control value generation circuit 2500.

Referring to FIG. 18, the transistors PU1, PU2, PU3, and PU4 may be turned off in response to the digital bits "1111" of the control value CVU. The transistors PD1 and PD2 may be turned on in response to the upper digital bits "11" of the control value CVD. The transistors PD3 and PD4 may be turned off in response to the lower digital bits "00" of the control value CVD. Accordingly, the write current IW of 50 µA may be driven through the turned-on transistors PD1 and PD2.

For example, the case of FIG. 17 may be associated with a case intended to store a data value of logic "0" in the memory cell 100, and the case of FIG. 18 may be associated with a case intended to store a data value of logic "1" in the memory cell 100. For example, depending on a value of data buffered in the data buffer 1316, the control value CVU of "0011" or "1111" may be selectively provided to the transistors PU1, PU2, PU3, and PU4, and the control value CVD of "0000" or "1100" may be selectively provided to the transistors PD1 PD2, PD3, and PD4. To accomplish this, for example, a circuit, such as a switch, a multiplexer, and/or the like, may be used.

As mentioned above, the threshold intensity of the write current IW may be 45 µA at an operation temperature of 60° C. As described with reference to FIGS. 16 to 18, the write current IW may be driven to have the intensity of 50 µA which is greater than or equal to the threshold intensity. The intensity of 50 µA may correspond to the minimum intensity among the intensities of the write currents IR2, IR3, and IR4 which can switch the data state of the memory cell 100.

When the write current IW always has the highest intensity of 70 µA, a current intensity greater than or equal to the threshold intensity may be secured in any operation condition. However, unnecessary power consumption may occur. On the other hand, as described with reference to FIGS. 16 to 18, when the write current IW has the integrity of 50 µA which is suitable for a given operation condition, power consumption may decrease and efficiency and reliability may be increased.

While the present inventive concept has been described with reference to exemplary embodiments thereof, it will be apparent to those of ordinary skill in the art that various changes and modifications may be made thereto without departing from the spirit and scope of the present inventive concept as set forth in the following claims.

What is claimed is:
1. A memory device, comprising:
a memory cell array comprising a memory cell, the memory cell configured to store first data based on a first write current;
a write driver configured to output the first write current based on a control value; and a current controller comprising a replica memory cell, the current controller configured to generate the control value based on a state of second data which is stored in the replica memory cell,
wherein an intensity of the first write current is adjusted based on the control value,
wherein the state of the second data is switched between a first value and a second value when an intensity of a second write current provided to the replica memory cell is greater than or equal to a threshold intensity, and the control value is a digital code including a digital bit which is indicative of whether the state of the second data is switched,
wherein the current controller is configured to copy a reference current according to different mirroring ratios to drive a plurality of second write currents which are used to generate the control value.

2. The memory device of claim 1, wherein the threshold intensity changes depending on a temperature at which the memory device operates.

3. The memory device of claim 1, wherein the write driver is configured to drive write currents having different intensities, and the intensity of the first write current is adjusted to have one of the different intensities.

4. The memory device of claim 3, wherein the intensity of the first write current is adjusted to be greater than or equal to the threshold intensity and to be smaller than or equal to a maximum intensity of the different intensities.

5. The memory device of claim 1, wherein the current controller comprises:
a plurality of replica memory cells comprising the replica memory cell;
a current source circuit configured to supply the plurality of second write currents to the plurality of replica memory cells, the plurality of second write currents having different intensities; and
a control value generation circuit configured to generate the control value by sensing whether states of data stored in the plurality of replica memory cells are switched based on the plurality of second write currents.

6. The memory device of claim 5, wherein the current source circuit comprises transistors configured to drive the plurality of second write currents by copying the reference current according to different mirroring ratios, and the different intensities of the plurality of second write currents correspond to the different mirroring ratios.

7. The memory device of claim 5, wherein each of the plurality of replica memory cells includes components identical to components included in the memory cell, characteristics of the components included in each of the plurality of replica memory cells are identical to characteristics of the components included in the memory cell, and connections between the components included in each of the plurality of replica memory cells are identical to connections between the components included in the memory cell.

8. The memory device of claim 5, wherein the control value generation circuit is configured to generate the control value such that the intensity of the first write current corresponds to a lowest intensity of intensities of the second write currents supplied to replica memory cells, at which switching of states of data is sensed, among the plurality of replica memory cells.

9. A memory device, comprising:
a memory cell array configured to store data based on a first write current;
a write driver configured to drive the first write current based on a control value, such that a first intensity of the first write current is adjusted; and
a current controller configured to:
select a second write current, which changes a state of the data, from among a plurality of write currents having different intensities, and
generate the control value corresponding to a second intensity of the second write current, wherein the first intensity is adjusted to correspond to the second intensity based on the control value,
wherein the current controller comprises:
a current source circuit configured to output the plurality of write currents; and
a plurality of replica memory cells configured to store data based on the plurality of write currents,
wherein the current source circuit comprises transistors having different sizes to drive the plurality of write currents, and each of the plurality of replica memory cells is a copy of a memory cell included in the memory cell array.

10. The memory device of claim 9, wherein the first intensity is adjusted such that the state of the data is changed from a first value to a second value.

11. The memory device of claim 9, wherein the plurality of replica memory cells has different resistance values, and the plurality of write currents has the different intensities.

12. The memory device of claim 9, wherein states of the data stored in the plurality of replica memory cells are changed or maintained, based on respective ones of the plurality of write currents, and the current controller is configured to determine, as the second write current, a write current having a lowest intensity among the plurality of write currents supplied to replica memory cells, at which the states of the data are switched, among the plurality of replica memory cells.

13. The memory device of claim 9, wherein the write driver comprises transistors each of which is turned on or turned off based on the control value, and the first intensity corresponds to a sum of intensities of currents driven by turned-on transistors of the transistors.

14. A memory device, comprising:
first transistors configured to drive first write currents having different intensities;
replica memory cells configured to store data based on the first write currents;
a control value generation circuit configured to generate a control value depending on whether states of the data stored in the replica memory cells are switched based on the first write currents;
second transistors configured to drive a second write current as each of the second transistors is turned on or turned off based on the control value; and
a memory cell array configured to store data based on the second write current,
wherein the control value is associated with an intensity of a switch write current of the first write currents, wherein the switch write current switches the states of the data stored in the replica memory cells, and wherein when states of the data stored in two or more replica memory cells among the replica memory cells are switched based on first write currents, which are supplied to the two or more replica memory cells, among the first write currents, the intensity of the switch write current corresponds to a lowest intensity of intensities of the supplied first write currents.

15. The memory device of claim 14, wherein an intensity of the second write current changes depending on a number of second transistors which are turned on among the second transistors.

16. The memory device of claim 14, wherein the second transistors are configured to drive the second write current such that an intensity of the second write current corresponds to the intensity of the switch write current based on the control value.

* * * * *